United States Patent
Schwarz et al.

(10) Patent No.: US 6,897,532 B1
(45) Date of Patent: May 24, 2005

(54) MAGNETIC TUNNELING JUNCTION CONFIGURATION AND A METHOD FOR MAKING THE SAME

(75) Inventors: Benjamin C. E. Schwarz, Sunnyvale, CA (US); Kamel Ounadjela, Belmont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/122,733

(22) Filed: Apr. 15, 2002

(51) Int. Cl.[7] .......................................... H01L 29/788
(52) U.S. Cl. ................................ 257/367; 360/324.2
(58) Field of Search ...................... 257/367; 360/324.2

(56) References Cited

U.S. PATENT DOCUMENTS

| | | | | |
|---|---|---|---|---|
| 5,659,499 | A | * | 8/1997 | Chen et al. ............... 365/158 |
| 5,804,458 | A | * | 9/1998 | Tehrani et al. ................ 438/3 |
| 5,841,692 | A | | 11/1998 | Gallagher et al. |
| 5,904,459 | A | * | 5/1999 | Prathap et al. ................ 411/6 |
| 5,907,459 | A | * | 5/1999 | Shouji et al. ............... 360/322 |
| 6,110,751 | A | * | 8/2000 | Sato et al. ...................... 438/3 |
| 6,219,274 | B1 | * | 4/2001 | Shimazawa et al. ........ 365/158 |
| 6,358,756 | B1 | * | 3/2002 | Sandhu et al. ................. 438/3 |
| 6,365,419 | B1 | * | 4/2002 | Durlam et al. ................. 438/3 |
| 6,485,989 | B1 | * | 11/2002 | Signorini ....................... 438/3 |
| 6,518,071 | B1 | * | 2/2003 | Durlam et al. ................. 438/3 |
| 6,555,858 | B1 | * | 4/2003 | Jones et al. ................ 257/295 |
| 6,562,634 | B2 | * | 5/2003 | Bronner et al. ................ 438/3 |
| 6,587,371 | B1 | * | 7/2003 | Hidaka ....................... 365/173 |
| 6,617,658 | B2 | * | 9/2003 | Kajiyama ................... 257/421 |
| 6,656,371 | B2 | * | 12/2003 | Drewes ........................ 216/22 |
| 2002/0034094 | A1 | * | 3/2002 | Saito et al. ................. 365/158 |
| 2002/0036315 | A1 | * | 3/2002 | Adachi et al. .............. 257/310 |
| 2002/0055016 | A1 | * | 5/2002 | Hiramoto et al. ........... 428/692 |
| 2002/0122338 | A1 | * | 9/2002 | Park et al. .................. 365/200 |
| 2002/0132464 | A1 | * | 9/2002 | Lee ............................. 438/618 |
| 2002/0135950 | A1 | * | 9/2002 | Zhang et al. ............. 360/324.2 |
| 2002/0145835 | A1 | * | 10/2002 | Suzuki et al. ............ 360/324.2 |
| 2002/0186514 | A1 | * | 12/2002 | Childress et al. ........ 360/324.2 |
| 2003/0059958 | A1 | * | 3/2003 | Drewes ......................... 438/3 |
| 2003/0090844 | A1 | * | 5/2003 | Shimizu et al. ......... 360/324.12 |

FOREIGN PATENT DOCUMENTS

| | | | |
|---|---|---|---|
| JP | 57-42147 | * | 3/1982 |
| JP | 4-3305 | * | 1/1992 |
| JP | 11-134620 | * | 5/1999 |
| JP | 2001-84526 | * | 3/2001 |
| JP | 2001-267524 | * | 9/2001 |
| WO | WO 02/41367 | * | 5/2002 |

* cited by examiner

Primary Examiner—Nathan J. Flynn
Assistant Examiner—Ahmed N. Sefer
(74) Attorney, Agent, or Firm—Kevin L. Duffer; Mollie E. Lettang; Daffer McDaniel, LLP

(57) ABSTRACT

A method for forming a magnetic tunneling junction (MJT) is provided. In some embodiments, the method may include patterning one or more magnetic layers to form an upper portion of a MTJ. The method may further include patterning one or more additional layers to form a lower portion of the MTJ. In some cases, the lower portion may include a tunneling layer of the MTJ having a width greater than the upper portion. In addition, in some embodiments the method may further include patterning an electrode below the lower portion. In some cases, the electrode may include a lowermost layer with a thickness equal to or less than approximately 100 angstroms. In addition or alternatively, the electrode may have a width greater than the width of the tunneling layer. In yet other embodiments, the method may include forming spacers along the sidewalls of the upper and/or lower portions.

12 Claims, 7 Drawing Sheets

MAGNETIC TUNNELING JUNCTION CONFIGURATION AND A METHOD FOR MAKING THE SAME

BACKGROUND OF THE INVENTION

1. Field of the Invention

This invention relates to semiconductor device manufacturing, and more particularly, to an alternative magnetic tunneling junction configuration and a method for making such a structure.

2. Description of the Related Art

The following descriptions and examples are not admitted to be prior art by virtue of their inclusion within this section.

At various stages in the fabrication of semiconductor devices, it may be necessary to pattern one or more layers to form a semiconductor feature. Such a semiconductor feature may include, for example, a gate structure, an interconnect line, or a magnetic tunneling junction (MTJ) stack. The process parameters used for such a patterning process may affect the operation of the device comprising the semiconductor feature. For example, plasma etch techniques, which are typically used for metal etch processes, generally require temperatures greater than approximately 200° C. However, large temperature variations during a fabrication process of a semiconductor device may cause stress within the structures of the device. Consequently, temperature variations resulting from metal etch processes may degrade the performance and functionality of devices in some embodiments. In addition, high temperature etch processes may generally not be used with photolithographic resist masks since resist materials tend to degrade at temperatures greater than approximately 200° C. As such, a hardmask may be necessary during high temperature etch processes. In general, a hardmask layer may be formed by patterning the hardmask material using a resist mask and subsequently removing the resist mask. As such, using a hardmask may undesirably require more processing steps, increasing and complicating the fabrication process of the device.

In some embodiments, the use of a resist mask or a hardmask may additionally or alternatively depend on the etch chemistry used during the etch process of the semiconductor feature. For example, the use of a hardmask may be particularly advantageous in embodiments in which an etch chemistry that is not selective to the one or more layers of the semiconductor topography is used. For instance, an etch chemistry including an oxygen plasma is generally not more selective to layers of a semiconductor topography than to a resist mask. As such, an etch chemistry including an oxygen plasma may etch the resist mask at a similar or faster rate than adjacent layers. Consequently, a resist material may not adequately serve as a mask to pattern the semiconductor feature and thus, the use of a hardmask in such an embodiment may be needed. However, as stated above, the use of a hardmask undesirably requires additional fabrication time, increasing and complicating the fabrication process of the device.

Regardless of whether a resist mask or a hardmask is used to pattern a semiconductor feature, some etch processes used during the patterning process may alter or degrade the properties of layers or structures within the device. For example, an etch process including an oxygen plasma may degrade the magnetic properties of magnetic materials. As such, using an etch process including an oxygen plasma to pattern magnetic layers of a memory device including a MTJ, for example, may undesirably degrade the performance and/or functionality of the device. Moreover, some etch processes may cause material to be redeposited upon sidewalls of the semiconductor feature, varying the dimension of the semiconductor feature from its critical dimension specification. In some cases, such a redeposition of material may alter the functionality of the device or render the device inoperable. In addition or alternatively, sidewalls of semiconductor features may be exposed during some etch processes. In some cases, exposure of metal semiconductor feature surfaces, in particular, may allow shorts to occur across a metal feature, thereby degrading the functionality of the device. For example, a tunneling layer of a MJT may be susceptible to shorts occurring across the layer.

Therefore, it would be desirable to develop a method for etching metal layers within a semiconductor topography which overcomes one or more of the issues mentioned above. In particular, it would be advantageous to develop an etch process which allows the use of a resist mask and/or relatively low process temperatures. In addition, it may be desirable to develop an etch process which does not affect the properties of layers within a semiconductor topography, such that a device fabricated therefrom is not degraded or rendered inoperable. Moreover, it may be advantageous to fabricate a semiconductor device from such an etch process that is not susceptible to shorts occurring across its metal features.

SUMMARY OF THE INVENTION

The problems outlined above may be in large part addressed by a method for processing a semiconductor topography that includes patterning one or more metal layers arranged above a metal insulating layer and terminating the patterning process upon exposure of the metal insulating layer. In particular, the method may be adapted to be more selective to the metal insulating layer than the one or more metal layers of the semiconductor topography such that the patterning process may be stopped upon exposure of the metal insulating layer. In some embodiments, the method may be adapted to produce an etch selectivity between the one or more metal layers and the metal insulating layer which may be greater than approximately 1:1 or more specifically greater than approximately 10:1. In some embodiments, the etch selectivity may be between approximately 1:1 and approximately 20:1 or more specifically, approximately 15:1. For example, in some embodiments, the method may include etching the one or more metal layers at an etch rate of approximately 75 angstroms per minute, while the metal insulating layer may be etched at an etch rate equal to or less than approximately 5 angstroms per minute.

In some embodiments, the method may be further adapted to pattern the one or more metal layers with a resist mask rather than a hardmask. In addition or alternatively, the method may be adapted to pattern a semiconductor feature at a relatively low temperature. In particular, the method may be conducted at a temperature between approximately 20° C. and approximately 120° C. In some embodiments, the method may be conducted at a temperature between approximately 40° C. and approximately 90° C. or more specifically, at approximately 80° C. Moreover, the method may be adapted to prevent a deposition of etching particulates along sidewalls of the etched semiconductor feature.

In general, the adaptations of the method may include exposing the semiconductor topography to an etch chemistry comprising hydrogen bromide (HBr). In some cases, the etch chemistry may further include a fluorinated hydrocarbon, such as carbon tetrafluoride ($CF_4$), for example. In such an embodiment, the etch chemistry may include, for example, a HBr:CF$_4$ ratio between approximately 2:1 and approximately 4:1. Larger or smaller ratios, however, may be appropriate depending on the design specifications of the device and/or the process parameters of the patterning process. Moreover, in some embodiments the method may be a reactive ion etch process. As such, in some cases, the method may include supplying a source power between approximately 500 watts and approximately 1500 watts and more specifically at approximately 700 watts. In addition, the method may include applying a bias power between approximately 10 watts and approximately 150 watts. Furthermore, the method may be substantially absent of an oxygen plasma. In this manner, the method may, in some embodiments, include patterning one or more metal layers arranged above a metal insulating layer using a reactive ion etch process substantially absent of an oxygen plasma.

In either case, the metal insulating layer may include any metal insulating material, such as aluminum oxide, aluminum nitride, or zirconium oxide, for example. The one or more metal layers, on the other hand, may include any metallic material. In some cases, the one or more metal layers may include magnetic materials, such as nickel-iron, cobalt-iron, or nickel-iron-cobalt, for example. As such, in some embodiments the method described herein may be used to form a semiconductor feature including magnetic materials. For example, the method may include forming an upper portion of a magnetic tunneling junction (MTJ) by patterning one or more magnetic layers. In some cases, the method may further include patterning one or more additional layers to form a lower portion of the MTJ. In some embodiments, the lower portion may include a tunneling layer of the MTJ. More specifically, the upper most layer of the lower portion may include a tunneling layer of the MTJ.

In some cases, the lower portion may be patterned having a greater width than the upper portion in some cases. As such, a MTJ with a tunneling layer having a greater width than a width of an overlying magnetic layer may be fabricated. Alternatively stated, the MTJ may include a magnetic layer arranged above the tunneling layer having a smaller width than the tunneling layer. In some cases, the width of the tunneling layer may be approximately 10 angstroms to approximately 200 angstroms greater than the width of the overlying magnetic layer. However, larger or smaller widths of the tunneling layer with respect to the overlying magnetic layer may be used. In such an embodiment, the tunneling layer may be adapted to serve as an etch stop layer during a subsequent via etch process. As such, the method, in some embodiments, may further include depositing an interlevel dielectric above the tunneling layer and etching a via within the interlevel dielectric to expose a portion of the tunneling layer. In other embodiments, the lower portion of the MJT may include substantially the same width as the overlying magnetic layer or more specifically, substantially the same width as the upper portion of the MTJ.

In some embodiments, the lower portion of the MTJ may serve as an electrode such that electrical connection may be made to the lower portion by other conductive layers or structures. Alternatively, the method, in some embodiments, may further include patterning an electrode underneath the lower portion of the MTJ. In some cases, the electrode may have a width substantially similar to the lower portion of the MTJ. In this manner, a MTJ with a tunneling layer patterned in alignment with an underlying electrode may be fabricated. In other embodiments, the MTJ may include an electrode arranged below the tunneling layer having a width greater than the width of the tunneling layer. In either embodiment, the MTJ may further include one or more additional layers interposed between the tunneling layer and the electrode. In some cases, at least one of the one or more additional layers may have a width substantially similar to the width of the tunneling layer. In addition or alternatively, at least one of the one or more additional layers may have a width substantially similar to the width of the electrode. In this manner, the electrode may include a plurality of layers in some embodiments. For example, the electrode may include a seed layer in some cases. Such a seed layer may be arranged above the lowermost layer of the electrode or may serve as the lowermost layer of the electrode. In addition or alternatively, the electrode may include a pinning layer arranged above the lowermost layer of the electrode. Alternatively, the electrode may, in some embodiments, include a single layer. In either case, a lowermost layer of the electrode may include a thickness equal to or less than approximately 100 angstroms.

In some embodiments, the method may further include forming spacers along the sidewalls of the magnetic layer overlying the tunneling layer. More specifically, the method may include forming spacers along the sidewalls of the upper portion of the MTJ. Consequently, the MTJ may include spacers along the sidewalls of the overlying magnetic layer and adjacent portions of the tunneling layer in some embodiments. In some cases, the spacers may be formed prior to forming the lower portion of the MTJ. In such an embodiment, patterning the lower portion of the MTJ, in some cases, may include patterning one or more layers of the lower portion in alignment with the spacers arranged along the upper portion of the MTJ. Alternatively, the spacers may be formed subsequent to forming the lower portion of the MTJ. In either embodiment, a lateral boundary of the spacers may be in alignment with a sidewall of the tunneling layer. More specifically, a lateral boundary of the spacers may be in alignment with a sidewall of the lower portion of the MTJ.

In some cases, the method may further include forming spacers along the sidewalls of the lower portion of the MTJ. Such a formation of spacers along the sidewalls of the lower portion may be conducted subsequent to forming the lower portion. In some cases, the formation of the spacers along the sidewalls of the lower portion may be conducted at the same time as the formation of the spacers along the sidewalls of the upper portion. In other embodiments, the formation of the spacers along the sidewalls of the lower portion may be conducted at a different time than the formation of the spacers along the sidewalls of the upper portion. In either embodiment, the method may further include patterning an electrode arranged below the lower portion in some embodiments. In some cases, the method may include patterning the electrode in alignment with the spacers formed along the sidewalls of the lower portion. In this manner, the MTJ may include spacers formed along the sidewalls of the tunneling layer and adjacent portions of the electrode. In other embodiments, the method may include patterning the electrode prior to forming the spacers along the sidewalls of the lower portion. In either embodiment, a lateral boundary of the spacers arranged along the sidewalls of the lower portion may be in alignment with a sidewall of the electrode.

There may be several advantages for processing a semiconductor topography using the method described herein. For example, a semiconductor feature having one or more metal layers may be patterned over a metal insulating layer without removing a substantial portion of the metal insulating layer. Consequently, shorts occurring across the metal insulating layer may be prevented since sidewall surfaces of the metal insulating layer are not exposed. In addition, semiconductor features with magnetic layers may be patterned without having the magnetic properties of the layers altered. In particular, semiconductor features with magnetic layers may be formed without the use of an oxygen plasma. Moreover, semiconductor features may be patterned at relatively low temperatures such that exposure to relatively large temperature variations during the fabrication of the device may be decreased, thereby reducing the amount of stress contained within the device. Consequently, semiconductor devices with low thermal budgets may be fabricated using the method described herein. Another advantage of the method described herein is that a resist mask may be used for patterning the semiconductor features. In particular, a resist mask may be used while etching one or more metal layers above an underlying metal insulating layer. Consequently, a hardmask layer may not be needed, thereby reducing fabrication costs and processing time.

BRIEF DESCRIPTION OF THE DRAWINGS

Other objects and advantages of the invention will become apparent upon reading the following detailed description and upon reference to the accompanying drawings in which:

FIG. 7a depicts a partial cross-sectional view of the semiconductor topography in which the patterned resist layer is removed subsequent to etching the plurality of lower layers in FIG. 6a;

Figure 1:
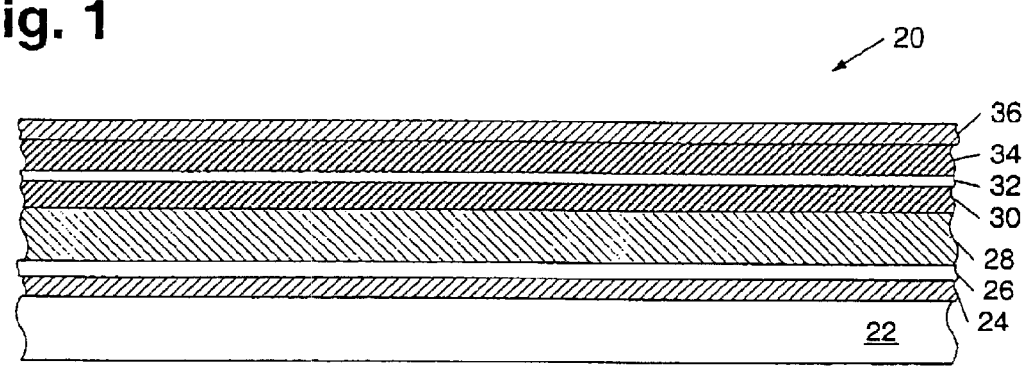
FIG. 1 depicts a partial cross-sectional view of a semiconductor topography including a plurality of layers.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary embodiments of methods for processing a semiconductor topography are shown in FIGS. 1–15. In particular, methods for patterning one or more metal layers arranged above a metal insulating layer are provided. In addition, methods of producing a magnetic tunneling junction (MTJ) stack within a semiconductor device are provided. FIG. 1 depicts a partial cross-sectional view of semiconductor topography 20 in layers 22–36 formed upon and in contact with each other. In some embodiments, semiconductor topography 20 may include additional layers formed upon and in contact with one or more of layers 22–36. Alternatively, semiconductor topography 20 may include fewer layers than shown in FIG. 1. As such, it is noted that several layer configurations may be used for the method described herein. Semiconductor topographies 20 and 54 shown in FIGS. 1–11 are merely shown as exemplary embodiments. In particular, the composition, thickness, number, and arrangement of layers within a semiconductor topography used for the method described herein may differ from those shown and described in FIGS. 1–15. For example, FIGS. 1–11 include layers which may be indicative of a MTJ stack, however, the method described herein may be used with any stack including one or more metal layers arranged above a metal insulating layer.

In an embodiment, semiconductor layer 22 may be an interlevel dielectric layer, which isolates overlying layers 24–36 from underlying layers and/or structures. In such an embodiment, semiconductor layer 22 may additionally serve as a diffusion barrier layer. In either case, semiconductor layer 22 may include a dielectric material, such as silicon dioxide ($SiO_2$), silicon nitride ($Si_xN_y$), silicon dioxide/silicon nitride (ON), silicon dioxide/silicon nitride/silicon dioxide (ONO), or tetraethylorthosilicate glass (TEOS) based silicon dioxide. In other embodiments, semiconductor layer 22 may further include structures and layers formed upon a semiconductor substrate and underlying the interlevel dielectric. The structures and layers may include, but are not limited to, dielectric layers, metallization layers, gate structures, contact structures, vias, or local interconnect wires. In addition or alternatively, diffusion regions and/or isolation regions (not shown) may be formed in semiconductor layer 22. In yet an alternative embodiment, semiconductor layer 22 may be a semiconductor substrate such as a silicon substrate, and may be doped either n-type or p-type. More specifically, semiconductor layer 22 may be a monocrystalline silicon substrate or a silicon-germanium substrate in some embodiments. In any embodiment, semiconductor layer 22 may include a thickness between approximately 300 angstroms and approximately 3000 angstroms. However, larger and smaller thicknesses may be appropriate for semiconductor layer 22 depending on the design specifications of the device.

As shown in FIG. 1, conductive layer 24 may be formed above semiconductor layer 22. In some embodiments, an additional dielectric layer (not shown) may be interposed between semiconductor layer 22 and conductive layer 24 to serve as a gate dielectric, a "pad" oxide, or an interlevel dielectric, for example. In other embodiments, such an additional dielectric layer may not be included within semiconductor topography 20. In some cases, conductive layer 24 may be adapted to couple with another conductive structure or layer such that an electrical connection may be made. As such, conductive layer 24 may include doped polysilicon or any metal material, such as aluminum, cobalt, copper, iron, nickel, nickel-iron-chromium, platinum, tantalum, titanium, tungsten, or a metal alloy thereof. In addition, the thickness of conductive layer 24 may be less than approximately 600 angstroms. Larger or smaller thicknesses of conductive layer 24, however, may be used depending on the design specifications of the device. For example, it may be advantageous for conductive layer 24 to have a thickness equal to or less than approximately 100 angstroms. Such a layer thickness may be desirable in an embodiment in which layers overlying conductive layer 24 are conductive and therefore, may additionally or alternatively serve as an electrode. Examples of such embodiments are discussed later in more detail with reference to the fabrication of MTJ devices. Consequently, in some cases, conductive layer 24 may be omitted from semiconductor topography 20 entirely. An embodiment of a semiconductor topography without such a conductive layer is shown and described in more detail below in FIGS. 9 and 10.

In some embodiments, semiconductor topography 20 may further include seed layer 26 formed above conductive layer 24. Alternatively, seed layer 26 may be formed upon and in contact with semiconductor layer 22 in an embodiment in which conductive layer 24 is omitted from semiconductor topography 20. In some embodiments, seed layer 26 may serve to align the crystalline structure of an overlying antiferromagnetic (AFM) pinning layer of a MTJ. As such, seed layer 26 may include any material used in the semiconductor industry for aligning the crystalline structures layers within AFM materials. For example, seed layer 26 may include nickel-iron materials, such as permalloy, in some embodiments. However, other materials used for aligning the crystalline structure of AFM materials may be used of seed layer 26 depending on the design specifications of the device.

In other embodiments, seed layer 26 may serve additional or alternative purposes. For example, seed layer 26 may serve as an isolation or diffusion barrier for conductive layer 24. In such an embodiment, seed layer 26 may include a dielectric material, such as silicon dioxide or silicon nitride. In addition or alternatively, seed layer 26 may include a metal nitride, such as titanium nitride or tungsten nitride, for example. In yet other embodiments, seed layer 26 may be conductive to enhance the conductivity of conductive layer 24. In such an embodiment, seed layer 26 may include a metal, such as aluminum, copper, platinum, titanium, tungsten, a metal alloy thereof, or a metal silicide, such as titanium silicide or tungsten silicide, for example. In any embodiment, seed layer 26 may include a thickness between approximately 20 angstroms and approximately 1000 angstroms, and more specifically between approximately 20 angstroms and approximately 100 angstroms. However, larger and smaller thickness of seed layer 26 may be appropriate depending on the design specifications of the device.

In some embodiments, semiconductor topography 20 may further include pinning layer 28 interposed between seed layer 26 and lower metal layer 30. In an embodiment in which semiconductor topography 20 may be used to form a MTJ, pinning layer 28 may serve to orient and pin the magnetic direction of overlying lower metal layer 30 as described below. As such, pinning layer 28 may include any material used in the semiconductor industry for serving such a function. For instance, pinning layer 28 may include AFM materials such as alloys of platinum-manganese (Pt—Mn), nickel-manganese (Ni—Mn), and iron-manganese (Fe—Mn), for example. Other AFM materials, however, may be appropriate for pinning layer 28 depending on the design specifications of the device.

In other embodiments, pinning layer 28 may serve additional or alternative purposes. For example, pinning layer 28 may serve as an isolation or diffusion barrier for overlying lower metal layer 30. In such an embodiment, pinning layer 28 may include a dielectric material, such as silicon dioxide or silicon nitride. Alternatively, pinning layer 28 may include a metal nitride, such as titanium nitride or tungsten nitride, for example. In yet other embodiments, pinning layer 28 may be conductive to enhance the conductivity of conductive layer 24. In such an embodiment, pinning layer 28 may include a metal, such as aluminum, copper, titanium, tungsten, a metal alloy thereof, or a metal silicide, such as titanium silicide or tungsten silicide, for example. In any embodiment, pinning layer 28 may include a thickness between approximately 15 angstroms and approximately 3000 angstroms, and more specifically between approximately 100 angstroms and approximately 1000 angstroms. Larger or smaller thicknesses of pinning layer 28, however, may be used depending on the design specifications of the device.

As stated above, semiconductor topography 20 may further include lower metal layer 30 arranged upon pinning layer 28. In some embodiments, lower metal layer 30 may serve as a conductive layer adapted to make electrical connection with another conductive layer or structure. As such, lower metal layer 30 may include doped polysilicon, or any metal material, such as aluminum, copper, platinum, titanium, tungsten, or a metal alloy thereof. In other embodiments, lower metal layer 30 may serve as a fixed magnetic layer of a MTJ. More particularly, lower metal layer 30 may include a material adapted to maintain it magnetic orientation in a single direction. In this manner, the magnetic orientation of lower meta layer 30 may not be rotated in the presence of an applied magnetic field. As such, lower metal layer 30 may include any material used in the semiconductor industry for such a function. For instance, lower metal layer 30 may include ferromagnetic materials such as alloys of cobalt-iron, nickel-iron, or nickel-iron-cobalt, for example. Other ferromagnetic materials used in the semiconductor industry, however, may be used for lower metal layer 30.

In some embodiments, lower metal layer 30 may include a plurality of layers. For example, in some embodiments, lower metal layer 30 may include a plurality of ferromagnetic materials separated by one or more thin metallic layers. In such an embodiment, the plurality of ferromagnetic layers may include the same material in some cases. In other embodiments, the plurality of ferromagnetic layers may include different materials. In either embodiment, the configuration of the plurality of layers may increase the stability of the fixed magnetic layer. Whether lower metal layer 30 includes a single layer or a plurality layers, lower metal layer 30 may include a thickness between approximately 20 angstroms and approximately 1000 angstroms, and more specifically between approximately 20 angstroms and approximately 100 angstroms. Larger or smaller thicknesses of lower metal layer 30, however, may be used depending on the design specifications of the device.

As shown in FIG. 1, semiconductor topography 20 may further include metal insulating layer 32 formed above lower metal layer 30. In some embodiments, metal insulating layer 32 may serve to isolate lower metal layer 30 or upper metal layer 34 from respective overlying and underlying layers. As such, metal insulating layer 32 may include any metal oxide material, such as aluminum oxide, titianium oxide, tungsten oxide, or zirconium oxide, for example. In addition or alternatively, metal insulating layer 32 may include any metal nitride material, such as aluminum nitride, titanium nitride, or tungsten nitride, for example. Other metal oxides and/or metal nitrides used in the semiconductor industry, however, may also be used for metal insulating layer 32.

In some cases, metal insulating layer 32 may additionally or alternatively serve as a tunneling layer of a MTJ. More specifically, metal insulating layer 32 may serve to provide quantum mechanical tunneling between lower metal layer 30 and upper metal layer 34 in embodiments in which semiconductor topography 20 may be used to form a MTJ. As such, metal insulating layer 32 may include materials used in the semiconductor industry for such an application. For example, metal insulating layer 32 may include aluminum oxide, aluminum nitride, or zirconium oxide in some embodiments. In either embodiment, metal insulating layer 32 may include a thickness between approximately 5 angstroms and approximately 300 angstroms, and more specifically between approximately 6 angstroms and approximately 25 angstroms. However, larger or smaller thicknesses of metal insulating layer 32 may be appropriate depending on the design specifications of the device.

As stated above, semiconductor topography 20 may further include upper metal layer 34 arranged above metal insulating layer 32. In some embodiments, upper metal layer 34 may serve as a conductive layer adapted to make electrical connection with another conductive layer or structure. As such, upper metal layer 34 may include doped polysilicon, or any metal material, such as aluminum, copper, platinum, titanium, tungsten, or a metal alloy thereof. In other embodiments, upper metal layer 34 may serve as a "free" magnetic layer of a MTJ. More particularly, upper metal layer 34 may be adapted such that its magnetic orientation is able to rotate relative to the magnetic direction of lower metal layer 30 in an embodiment in which semiconductor topography 20 is used to form a MTJ. As such, upper metal layer 34 may include any material used in the semiconductor industry for such a function. For instance, upper metal layer 34 may include ferromagnetic materials such as cobalt-iron, nickel-iron, or nickel-iron-cobalt alloys, for example. Other ferromagnetic materials used in the semiconductor industry, however, may also or alternatively be used for upper metal layer 34. Furthermore, in an embodiment in which upper metal layer 34 and lower metal layer 30 may be used to form a MJT, both of the layers may be arranged such that their easy axes of magnetization are parallel to one another.

In some embodiments, upper metal layer 34 may include a plurality of layers. For example, in some embodiments, upper metal layer 30 may include a plurality of ferromagnetic materials. In such an embodiment, the plurality of ferromagnetic layers may include the same material in some cases. In other embodiments, the plurality of ferromagnetic layers may include different materials. In either embodiment, upper metal layer 34 may include a thickness between approximately 20 angstroms and approximately 1000 angstroms, and more specifically between approximately 20 angstroms and approximately 100 angstroms. However, larger or smaller thicknesses of upper metal layer 34 may be used depending on the design specifications of the device.

Moreover, semiconductor topography 20 may include cap layer 36 as shown in FIG. 1. In some embodiments, cap layer 36 may serve as an insulation or barrier layer. As such, cap layer 36 may include a dielectric such as silicon dioxide or silicon nitride, for example. In other embodiments, cap layer 36 may include a metal nitride layer, such as titanium nitride or tungsten nitride, for example. In an alternative embodiment, cap layer 36 may serve as a conductive layer such that electrical connection with other conductive structures or layers may be made. For example, cap layer 36 may serve as an upper electrode layer of a MTJ in some embodiments. Consequently, cap layer 36 may include doped polysilicon or any metal material, such as aluminum, cobalt, copper, iron, nickel, nickel-iron-chromium, platinum, tantalum, titanium, tungsten, or a metal alloy or silicide thereof. In any embodiment, the thickness of cap layer 36 may be between approximately 20 angstroms and approximately 1000 angstroms, and more specifically between approximately 20 angstroms and approximately 100 angstroms. However, larger or smaller thicknesses of cap layer 36 may be appropriate depending on the design specifications of the device.

Figure 2:
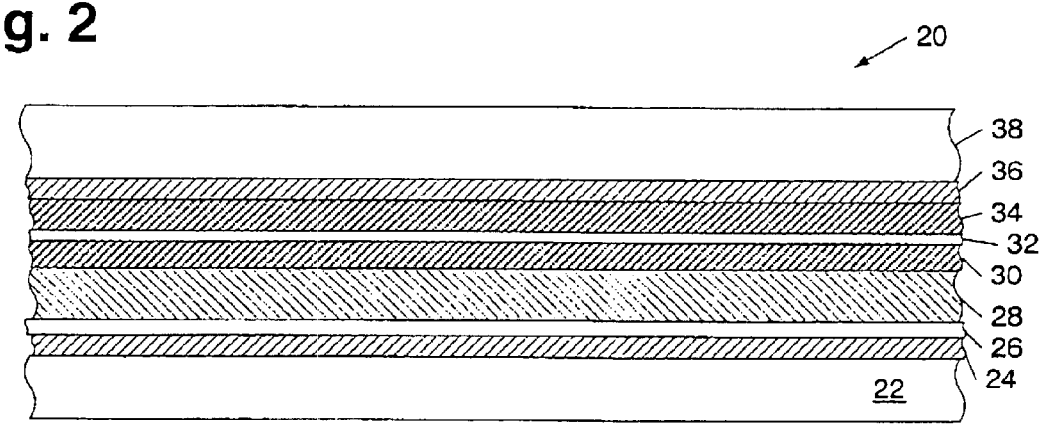
FIG. 2 depicts a partial cross-sectional view of the semiconductor topography of FIG. 1 in which a resist layer is formed above the plurality of layers.
Figure 3:
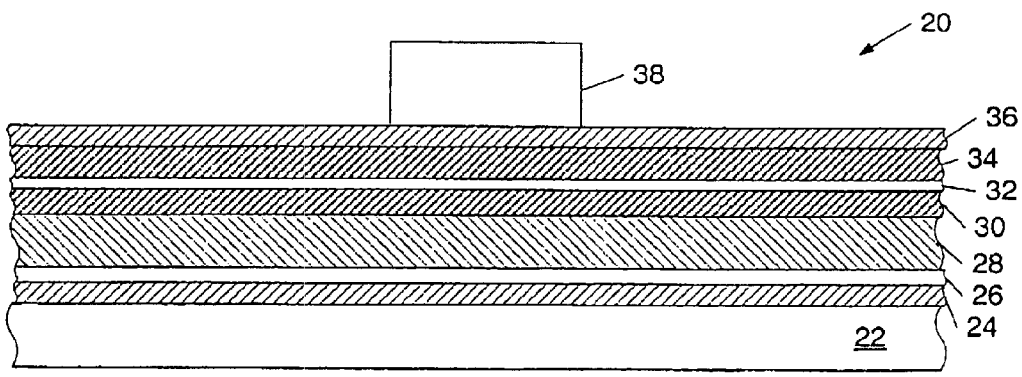
FIG. 3 depicts a partial cross-sectional view of the semiconductor topography in which a resist layer is patterned subsequent to the deposition of the resist layer in FIG. 2.

As shown in FIG. 2, resist 38 may be formed above cap layer 36. In some embodiments, an anti-reflective layer may be interposed between cap layer 36 and resist 38. In general, resist 38 may include a photoresist, such as a deep ultraviolet resist, an I-line resist, a G-line resist, or another resist, such as an e-beam resist or an x-ray resist. The thickness of resist 38 may be between approximately 5000 angstroms and approximately 10,000 angstroms. Larger or smaller thicknesses of resist 38, however, may be used depending on the parameters of the fabrication process. In some embodiments, resist 38 may be patterned as shown in FIG. 3. In this manner, the method may be adapted to pattern the one or more metal layers with a resist mask rather than a hardmask. Such a patterning process may include lithography techniques used in the semiconductor industry. Although FIG. 3 illustrates the formation of a single structure, any number of structures may be formed across semiconductor topography 20 in accordance with design specifications of the device. In addition, the structures may be formed with various dimensions and spacings therebetween in accordance with the design specifications of the device.

Figure 4:
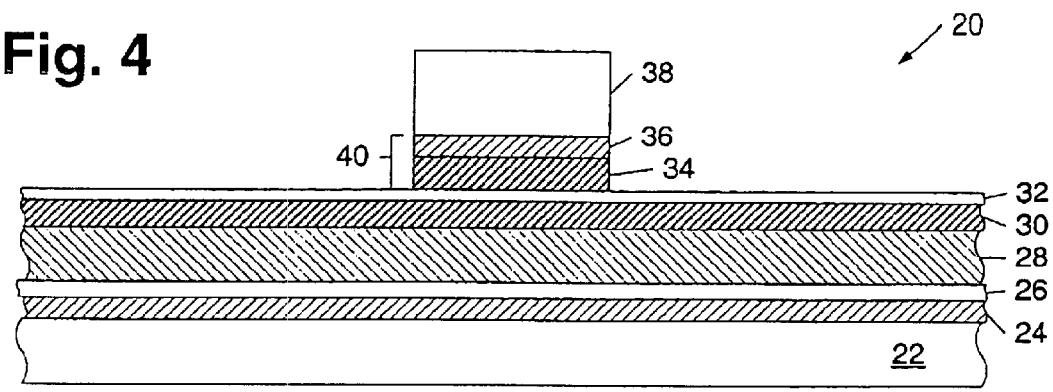
FIG. 4 depicts a partial cross-sectional view of the semiconductor topography in which exposed portions of the semiconductor topography are etched subsequent to the patterning of the resist layer in FIG. 3.

After the formation of the resist mask, exposed portions of semiconductor topography 20 may be etched as shown in FIG. 4. In particular, exposed portions of cap layer 36 and upper metal layer 34 may be etched to expose metal insulating layer 32. Such an etch process may be adapted to be more selective to metal insulating layer 32 than cap layer 36 and/or upper metal layer 34. For example, in some embodiments, the etch process may have a ratio of upper metal layer to metal insulating layer etch selectivity greater than approximately 1:1 or more specifically greater than approximately 10:1. In some embodiments, the etch selectivity may be between approximately 1:1 and approximately 20:1, more specifically between approximately 10:1 and approximately 20:1, and preferably at approximately 15:1. For instance, in some embodiments, the etch process may be adapted to etch upper metal layer 34 at an etch rate of approximately 75 angstroms per minute. Conversely, the etch process in the same embodiment may be adapted to etch metal insulating layer 32 at an etch rate equal to or less than approximately 5 angstroms per minute.

In this manner, the etch process may be adapted to substantially terminate upon metal insulating layer 32. Consequently, lower portions of semiconductor topography 20 may be protected from the etch process used to form upper portion 40. In this manner, the lower portions of semiconductor topography 20 may be protected from corrosive ambients, such as air pollutants and/or etch chemistries. In some cases, similar etch selectivities and/or etch rates may additionally or alternatively be referenced with regard to cap layer 36. In any case, smaller or larger etch selectivities and/or etch rates than those stated above may be appropriate depending on the process parameters of the etch process and the composition of resist 38, cap layer 36, and upper metal layer 34.

As stated above, the etch process used to etch exposed portions of cap layer 36 and upper metal layer 34 may be adapted to be more selective to metal insulating layer 32 than cap layer 36 and/or upper metal layer 34. In addition, the etch process may be adapted to prevent a deposition of etching particulates along sidewalls of the cap layer 36 and upper metal layer 34 during the etch process. Consequently, the etch process may include one or more process parameters adapted to produce the etch selectivity noted above and prevent the redeposition of particulate matter etched from cap layer 36 and upper metal layer 34. For example, the etch process may include exposing semiconductor topography 20 to an etch chemistry comprising hydrogen bromide (HBr), in some cases. =In some embodiments, the etch chemistry may further include a fluorinated hydrocarbon, such as $CHF_3$, $CF_4$, $C_2F_6$, $C_2H_2F_4$, or $C_4H_2F_6$, for example. Other fluorinated hydrocarbons may also be used depending on the other etch process parameters, material composition of the layers, and the design specifications of the device.

In general, the ratio of etchant gases in the etch chemistry may vary depending on the etch tool, process parameters of the etch process, and the composition of cap layer 36 and upper metal layer 34. For example, the addition and/or increase of a fluorinated hydrocarbon in the etch chemistry may, in some embodiments, increase the selectivity of the etch process. In this manner, the ratio of etch chemistry components may be optimized to produce the etch selectivities noted above. For example, the etch chemistry may include a $HBr:CF_4$ ratio between approximately 2:1 to approximately 4:1 in some embodiments. More specifically, the etch chemistry may include a $HBr:CF_4$ ratio of approximately 3:1. In some cases, the etch chemistry may further include an inert gas such as argon (Ar) or xenon (Xe). As such, in some embodiments, the etch chemistry may include a $HBr:CF_4:Ar$ ratio between approximately 2:1:1 and approximately 4:1:1 or more specifically, a ratio of approximately 3:1:1, for example. Larger or smaller ratios of etchant components may be appropriate, however, depending on the process parameters of the etch process, the material composition of the layers, and the design specifications of the device.

In addition or alternatively, the etch process used to etch exposed portions of cap layer 36 and upper metal layer 34 may include other adaptations such that the method is more selective to metal insulating layer 32 than the etched layers. For example, the etch process may be a reactive ion etch process in some embodiments. As such, in some cases, the etch process may include supplying a source power between approximately 500 watts and approximately 1500 watts and more specifically at approximately 700 watts. In addition, the etch process may include applying a bias power between approximately 10 watts and approximately 150 watts or more specifically between approximately 20 watts and approximately 80 watts. Furthermore, the etch process may be substantially absent of an oxygen plasma. In this manner, properties of layers, such as magnetic materials, may not be undesirably altered by the etch process.

In addition or alternatively, the etch process may be conducted at a temperature between approximately 20° C. and approximately 120° C. In some embodiments, the etch process may be conducted at a temperature between approximately 40° C. and approximately 90° C. or more specifically, at a temperature at approximately 80° C. In this manner, the etch process may be adapted to pattern a semiconductor feature at a relatively low temperature. Higher or lower temperatures may be appropriate depending on the process parameters of the etch process and the material composition of the layers. However, temperatures greater than approximately 150° C. may tend to reduce the selectivity of the etch chemistry. In addition, temperature less than approximately 30° C. may be volatile, undesirably introducing a safety hazard into the fabrication process.

Figure 5:
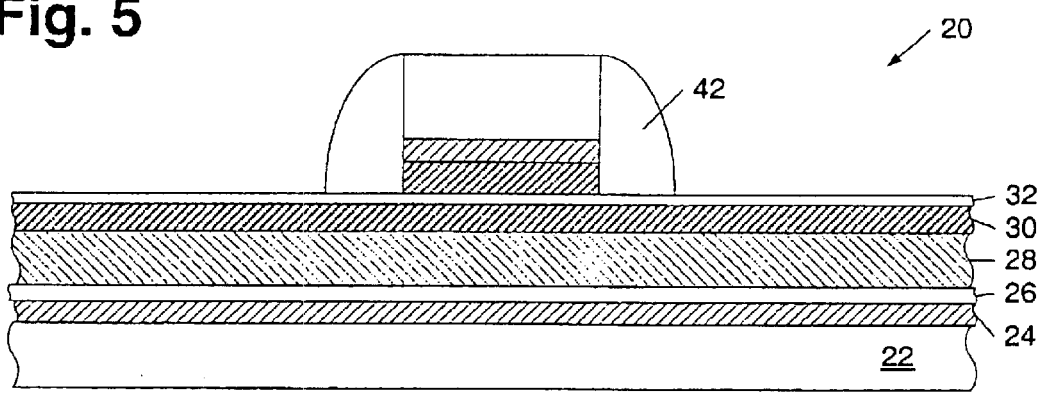
FIG. 5 depicts a partial cross-sectional view of the semiconductor topography in which spacers are formed along the sidewall surfaces of the etched portions subsequent to etching the exposed portions in FIG. 4.

FIG. 5 illustrates the formation of spacers 42 along the sidewalls of the patterned portions of resist 38, cap layer 36, and upper metal layer 34. In addition, spacers 42 may also be formed upon adjacent portions of metal insulating layer 32. The formation of such spacers may include depositing a dielectric material, such as silicon dioxide or silicon nitride over semiconductor topography 20 subsequent to the patterning process of FIG. 4. Such a dielectric layer may be anisotropically etched to form spacers 42. The anisotropic etch process may include one of several dry etch techniques used in the semiconductor industry for etching a layer in a substantially more vertical direction rather than a horizontal direction. In general, spacers 42 may be used to isolate cap layer 34 and upper metal layer 34 from adjacent structures or layers. In particular, spacers 42 may serve to prevent a short occurring across either of the layers. In addition or alternatively, spacers 42 may serve to protect the layers from corrosive ambients, such as air pollutants and/or etch chemistries.

Figure 6A:
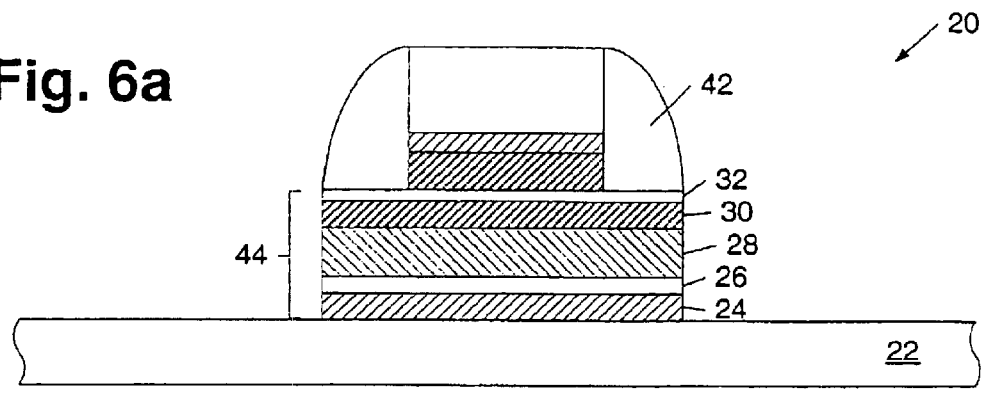
FIG. 6a depicts a partial cross-sectional view of the semiconductor topography in which a plurality of lower layers are patterned subsequent to the spacer formations in FIG. 5.
Figure 6B:
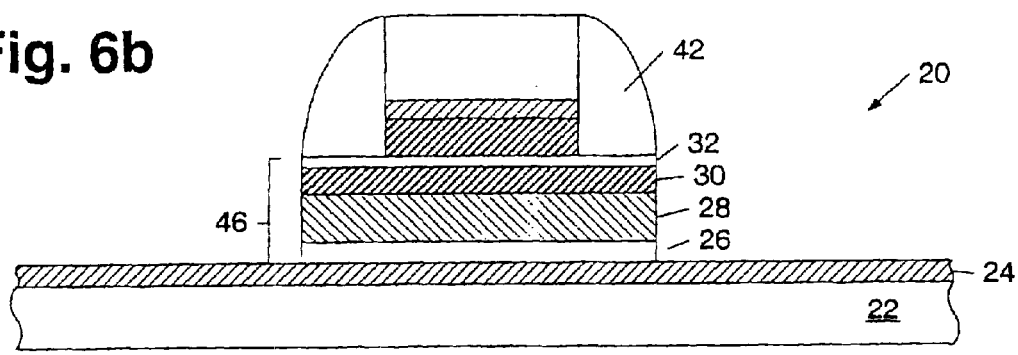
FIG. 6b depicts a partial cross-sectional view of the semiconductor topography, in an alternative embodiment, in which a plurality of lower layers are patterned subsequent to the spacer formations in FIG. 5.
Figure 6C:
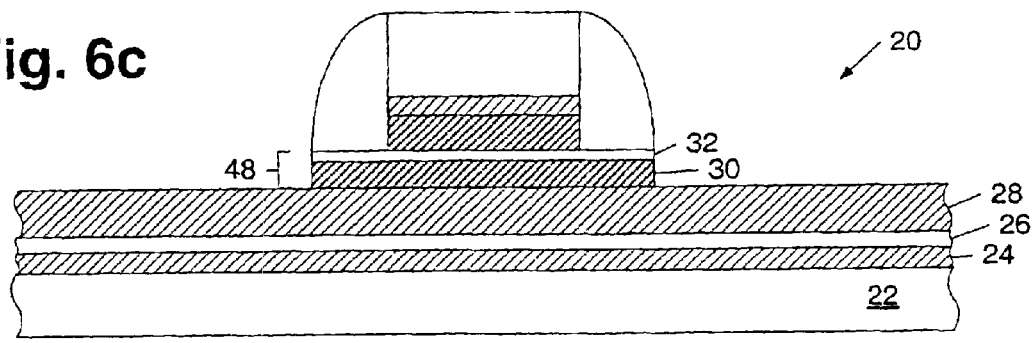
FIG. 6c depicts a partial cross-sectional view of the semiconductor topography, in yet another embodiment, in which a plurality of lower layers are patterned subsequent to the spacer formations in FIG. 5.
Figure 9:
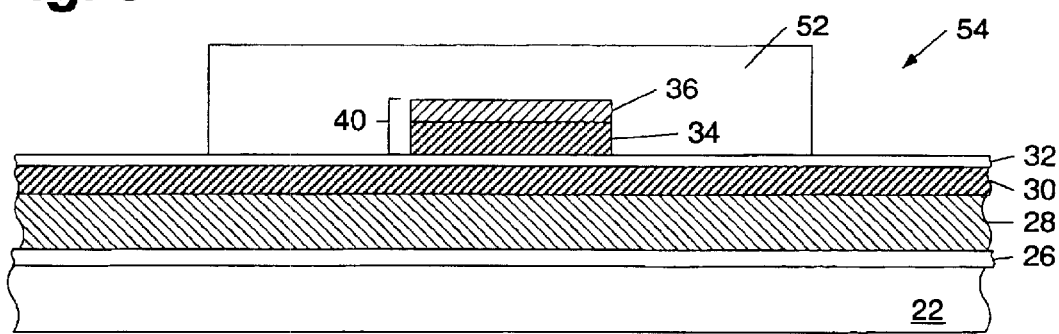
FIG. 9 depicts a partial cross-sectional view of a semiconductor topography, in an alternative embodiment, including a resist mask formed above a patterned portion and upon adjacent portions of underlying layers.
Figure 10:
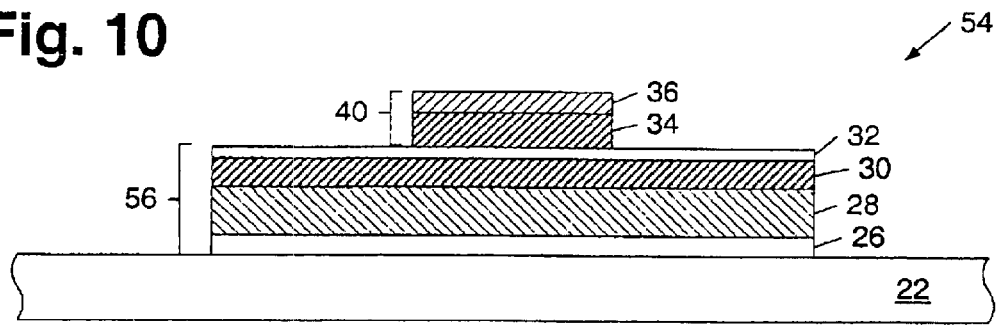
FIG. 10 depicts a partial cross-sectional view of the semiconductor topography of FIG. 9 in which a plurality of the underlying layers are patterned.

In addition, as shown in FIGS. 6a–6c, spacers 42 may be used to pattern a lower portion of semiconductor topography 20 in some embodiments. In particular, in some cases spacers 42 may be used as a hardmask to pattern a lower portion of semiconductor topography 20. In other embodiments, a resist mask may additionally or alternatively be used to form the lower portion of semiconductor topography 20. For example, a resist mask may be formed upon resist mask 38, spacers 42, and in some cases, portions of metal insulating layer 32. In yet another embodiment, spacers 42 may be omitted from semiconductor topography 20. In such an embodiment, a resist mask may be formed upon resist mask 38 and portions of metal insulating layer 32 to pattern a lower portion of semiconductor topography 20. An example of such an embodiment is illustrated in FIGS. 9 and 10, which are described below.

Regardless of whether a resist mask or spacers 42 are used to pattern a lower portion of semiconductor topography 20, such a lower portion may have a greater width than upper portion 40 as shown in FIGS. 6a–6c. In this manner, a MTJ may be formed with a tunneling layer (i.e., metal insulating layer 32) having a width greater than a width of an overlying magnetic layer (i.e., upper metal layer 34), when semiconductor topography 20 includes layers indicative of a MTJ. In some cases the width of the tunneling layer may be approximately 10 angstroms to approximately 200 angstroms greater than the width of the overlying magnetic layer. However, larger or smaller widths of the tunneling layer with respect to the overlying magnetic layer may be used. For example, the lower portion of semiconductor topography 20 may be patterned to have a substantially similar width as upper portion 40.

As stated above, a lower portion of semiconductor topography 20 may be patterned as shown in FIGS. 6a–6c. In particular, FIGS. 6a–6c illustrate different embodiments of patterning one or more layers of semiconductor topography 20 to form a lower portion of a patterned structure. For instance, FIG. 6a illustrates layers 24–32 patterned in alignment with spacers 42 to form lower portion 44. In an alternative embodiment, conductive layer 24 may be omitted from semiconductor topography 20. In such an embodiment, the patterning process may include etching portions of layers 26–32 to form lower portion 44. In either embodiment, lower portion 44 may serve as a lower electrode of the patterned structure in some cases. For example, in an embodiment in which semiconductor topography 20 includes magnetic materials to form a MTJ, lower portion 44 may serve as the base electrode of the MTJ.

As stated above, lower portion 44 may be patterned having a greater width than upper portion 40. In this manner, the MTJ may include a tunneling layer (i.e., metal insulating layer 32) in alignment with an underlying electrode. In addition, a lateral boundary of spacers 42 may be in alignment with a tunneling layer of a MTJ. Moreover, an electrode formed in such an embodiment may include a plurality of layers. As such, the base layer of the electrode may not need to be as thick as a conventional device comprising an electrode with a single layer. For example, in some embodiments, lower portion 44 may include a lower-most layer with a thickness less than approximately 100 angstroms. In general, the etch process used to produce lower portion 44 may be adapted to substantially terminate upon exposure of semiconductor layer 22. For example, in some embodiments, the etch process may include wet or dry etch techniques such as ion milling or reactive ion etch processes. In addition, the etch process may include using an etch chemistry comprising chlorine and argon or carbon tetrafluoride and argon.

In another embodiment, the method for processing a semiconductor topography may include patterning layers 26–32 in alignment with spacers 42 to form lower portion 46 as shown in FIG. 6b. In such an embodiment, the widths of lower portion 46 and conductive layer 24 may be different. As such, conductive layer 24 may, in some embodiments, serve as an electrode. In an embodiment in which semiconductor topography 20 is used to form a MTJ, for example, conductive layer 24 may serve as a base electrode of the MTJ. In this manner, the MTJ may include an electrode having a greater width than a tunneling layer of the MTJ (i.e., metal insulating layer 32). In general, the etch process in such an embodiment may be adapted to substantially terminate upon exposure of conductive layer 24. As such, the etch process may include wet or dry etch techniques such as ion milling or reactive ion etch processes. In addition, the etch process may include using an etch chemistry comprising chlorine and argon or carbon tetrafluoride and argon, for example.

In yet another embodiment, semiconductor topography 20 may be patterned to form lower portion 48 as shown in FIG. 6c. In particular, metal insulating layer 32 and lower metal layer 30 may be patterned to form lower portion 48. As a result, the widths of lower portion 48 and underlying layers 24–28 may be different. As such, in some embodiments, layers 24–28 may serve as an electrode. Alternatively, in an embodiment in which conductive layer 24 is omitted from semiconductor topography 20, layers 26–28 may serve as an electrode. In either embodiment, the layers may serve as a base electrode of a MTJ. In such an embodiment, the base electrode may have a greater width than the tunneling layer of the MTJ (i.e., metal insulating layer 32). In addition, the base electrode may include a plurality of layers. As such, the base layer of the electrode may not need to be as thick as a conventional device comprising an electrode with a single layer. For example, in some embodiments, lower portion 48 may include a lower-most layer with a thickness less than approximately 100 angstroms. In general, the etch process may be adapted to substantially terminate upon exposure of pinning layer 28. For example, the etch process may include wet or dry etch techniques such as ion milling or reactive ion etch processes. In addition, in some embodiments the etch process may include using an etch chemistry comprising chlorine and argon or carbon tetrafluoride and argon.

Figure 7A:
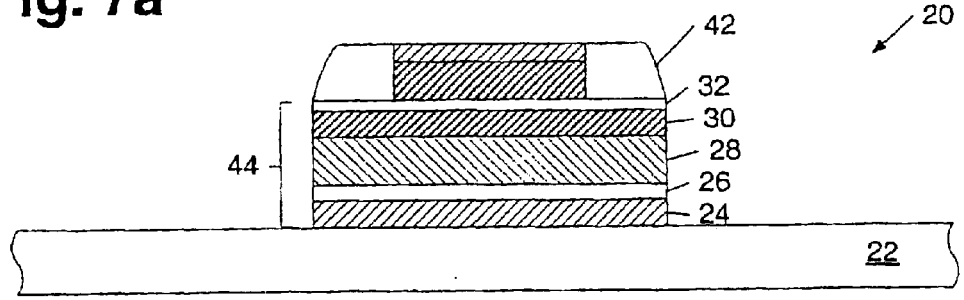

Regardless of the which layers are included in the lower portion of semiconductor topography 20 or which layers serve as an electrode of the semiconductor feature, semiconductor topography 20 may be further processed. For example, FIG. 7a illustrates the removal of resist 38 subsequent to the patterning process of FIG. 6a in which lower portion 44 is formed. Such a removal process may include a wet etching or stripping process, for example. As shown in FIG. 7a, upper portions of spacers 42 may also be removed during the removal of resist 38 such that spacers 42 are substantially coplanar with the upper surface of cap layer 36. A similar removal process of resist 38 may be conducted prior to the formation of lower portion 44 as well. In addition, the removal of resist 38 may be conducted prior to or subsequent to the formation of lower portions 46 and 48 of FIGS. 6b and 6c. For example, FIG. 7b illustrates the removal of resist 38 subsequent to the patterning process of FIG. 6b in which lower portion 46 is formed.

Figure 7B:
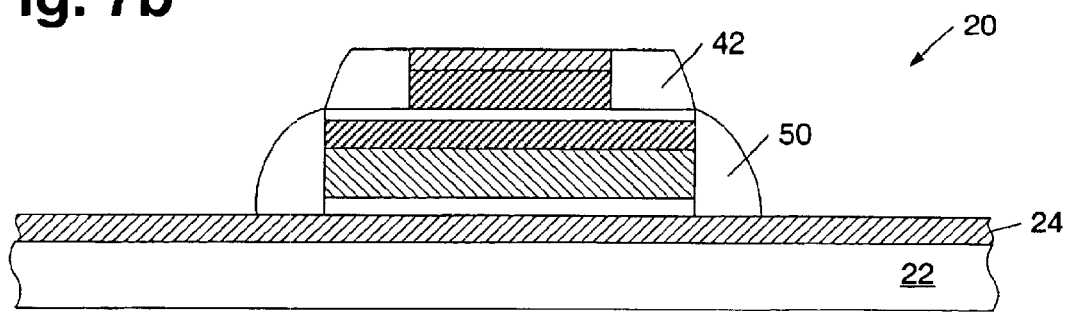
FIG. 7b depicts a partial cross-sectional view of the semiconductor topography in which the patterned resist layer is removed and spacers are formed along the sidewalls of the plurality of lower layers subsequent to etching the plurality of lower layers in FIG. 6b.
Figure 11:
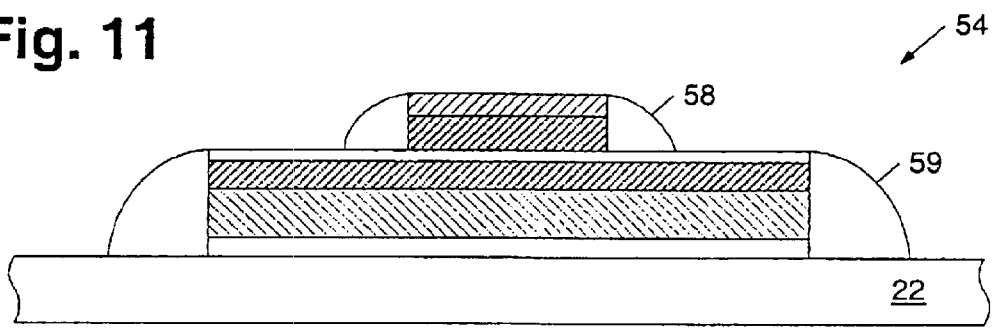
FIG. 11 depicts a partial cross-sectional view of the semiconductor topography in which spacers are formed along the sidewalls of the patterned portions subsequent to patterning the plurality of underlying layers in FIG. 10.

In addition, FIG. 7b illustrates the formation of spacers 50 along the sidewalls of lower portion 46 and upon adjacent portions of conductive layer 24. Similar spacers may be formed along the sidewalls of lower portions 44 and 48 of FIGS. 6a and 6c as well. In general, the formation of spacers 50 may be similar to the formation of spacers 42. In particular, spacers 50 may be formed by depositing a dielectric material, such as silicon dioxide or silicon nitride over semiconductor topography 20 subsequent to the removal of resist 38. Alternatively, the dielectric material may be deposited upon semiconductor topography 20 prior to the removal of resist 38. In such an embodiment, resist 38 may be removed subsequent to the formation of spacers 50. In either embodiment, the dielectric layer may be anisotropically etched to form spacers 50. In yet another embodiment, spacers 42 and 50 may be formed simultaneously and subsequent to the formation of lower portions 44, 46, or 48. In particular, spacers may be formed along the sidewalls of upper portion 40 and lower portion 44, 46, or 48 by depositing a dielectric material over semiconductor topography 20 after the formation of the lower portion 44, 46, or 48 and subsequently anisotropically etching the dielectric. Such an embodiment is illustrated in FIG. 11 which is described below. In yet another embodiment, spacers 50 may be omitted from semiconductor topography 20. An example of such an embodiment is illustrated in FIGS. 9 and 10, which are described below.

Figure 8:
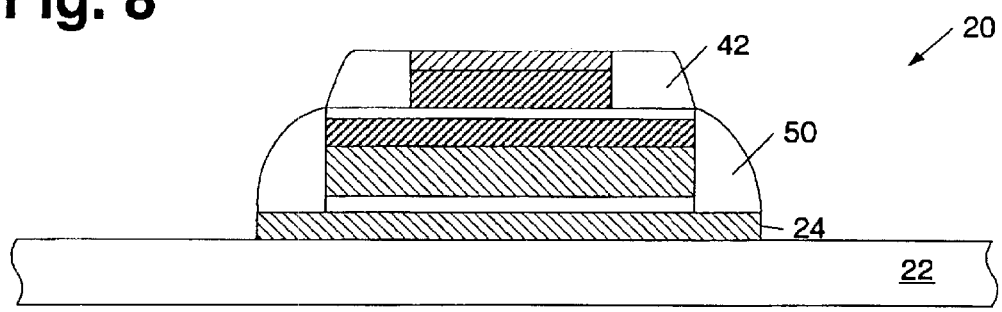
FIG. 8 depicts a partial cross-sectional view of the semiconductor topography in which a layer is patterned subsequent to spacer formations in FIG. 7b.

In general, spacers 50 may be used to isolate lower portion 44 from adjacent structures or layers. In particular, spacers 50 may serve to prevent a short from occurring across any of layers 26–32. Therefore, spacers 50 may serve to prevent a short from occurring across the tunneling layer of a MTJ (i.e., metal insulating layer 32) in some cases. In addition or alternatively, spacers 50 may serve to protect the layers from corrosive ambients, such as air pollutants and/or etch chemistries. Moreover and as shown in FIG. 8, spacers 50 may be used to pattern one or more layers underlying the lower portion of semiconductor topography 20 in some embodiments. In particular, spacers 50 may be used as a hardmask to pattern conductive layer 24 in some cases. In this manner, conductive layer 24 may be patterned in alignment with spacers 50 as shown in FIG. 8. Likewise, similarly positioned spacers may be used as a hardmask to pattern layers 24–28 in embodiments in which lower portion 48 is formed such as in FIG. 6c. Consequently, a semiconductor feature may be formed with spacers having a lateral boundary in alignment with a sidewall of an electrode.

In other embodiments, a resist mask may additionally or alternatively be used to pattern conductive layer 24. For example, a resist mask may be formed upon spacers 42 and 50, cap layer 36, and in some cases, portions of conductive layer 24. In yet another embodiment, spacers 50 may be omitted from semiconductor topography 20. As such, a resist mask may be formed upon cap layer 36, spacers 42, and in some cases, portions of conductive layer 24 to pattern conductive layer 24 in such an embodiment. An example of such an embodiment is illustrated in FIGS. 9 and 10, which are described below. Consequently, conductive layer 24 may be patterned at the same width as lower portion 46 in some embodiments. Alternatively, conductive layer 24 may be patterned at a greater width than lower portion 46. In this manner, in an embodiment in which semiconductor topography 20 is used to form a MTJ, a MTJ may include an electrode arranged below a tunneling layer having a width greater than the width of the tunneling layer.

As stated above, an alternative embodiment of the method described herein is illustrated in FIGS. 9–11. FIG. 9 depicts semiconductor topography 54 comprising a plurality of layers. In particular, FIG. 9 depicts layers 22, 26–36, and 52 formed upon each other. In general, layers 22 and 26–36 may include similar materials and thicknesses as those described for semiconductor topography 20 in FIG. 1. In some cases, semiconductor topography 54 may include additional layers interposed between layers 22, 26–36, and 52. Alternatively, semiconductor topography 54 may include fewer layers than shown in FIG. 9. It is noted that semiconductor topography 54 does not include a layer interposed between semiconductor layer 22 and seed layer 26. The exclusion of such a layer is shown to illustrate an embodiment in which a conductive layer, such as conductive layer 24, may be omitted. However, in some embodiments, semiconductor topography 54 may include a layer similar to conductive layer 24 interposed between semiconductor layer 22 and seed layer 26. As noted above, several layer configurations may be used for the method described herein. As such, semiconductor topography 54 shown in FIGS. 9–15 is merely an exemplary embodiment of a semiconductor topography that may be used with the method described herein. In particular, the composition, thickness, number, and arrangement of layers within semiconductor topography 54 may differ from those shown and described in FIGS. 9–15.

FIG. 9 depicts cap layer 36 and upper metal layer 34 patterned to form upper portion 40. Such a patterning process may be similar to that of the patterning process described for FIG. 4. As such, the patterning process may include forming a resist mask over a portion of cap layer 36 and upper metal layer 34 and exposing semiconductor topography 54 to an etch chemistry including HBr. Such a resist mask is distinct from resist mask 52 shown in FIG. 9 in that the resist mask used to pattern upper portion 40 may be arranged in alignment with such an upper portion. As described in more detail below, resist mask 52 shown in FIG. 9 may be used to pattern a lower portion of semiconductor topography 54. As such, resist mask 52 may be formed subsequent to the formation upper portion 40. In some cases, the etch chemistry used to pattern upper portion 40 may further include a fluorinated hydrocarbon, such as $CHF_3$, $CF_4$, $C_2F_6$, $C_2H_2F_4$, or $C_4H_2F_6$, for example. In addition or alternatively, the etch chemistry may include an inert gas such as argon (Ar) or xenon (Xe). In either embodiment, similar etch selectivities and etch rates as those described for the patterning process of upper portion 40 in FIG. 4 may be obtained for the patterning process of upper portion 40 in FIG. 9.

Moreover, the etching process of upper portion 40 may be a reactive ion etch process in some embodiments. As such, in some cases, the etching process may include supplying a source power between approximately 500 watts and approximately 1500 watts and more specifically at approximately 700 watts. In addition, the etching process may include applying a bias power between approximately 10 watts and approximately 150 watts or more specifically between approximately 20 watts and approximately 80 watts. Furthermore, the etching process may be substantially absent of an oxygen plasma. In addition or alternatively, the etching process may be conducted at a temperature between approximately 20° C. and approximately 120° C. In some embodiments, the etching process may be conducted at a temperature between approximately 40° C. and approximately 90° C. or more specifically, at a temperature of approximately 80° C.

As shown in FIG. 9, semiconductor topography 54 further includes resist mask 52 arranged over lower portion 40 and adjacent portions of metal insulating layer 32. As stated above, the formation of such a resist mask may be subsequent to the formation of lower portion 40. In some embodiments, the formation of resist mask 52 may be subsequent to the removal of the resist mask used to form lower portion 40. Alternatively, resist mask 52 may be formed above such a resist mask. As described below in reference to FIGS. 6a–8, spacers may advantageously be used in some embodiments in place of a resist mask to pattern portions of a semiconductor topography. However, in some cases, a resist mask may be advantageous. In particular, patterning with a resist mask may advantageously allow different widths of the lower portion to be fabricated. For instance, the use of a resist mask may allow a lower portion to have a greater or smaller width than the width of an overlying upper portion with spacers formed thereabout. As such, the method described herein may use either of such patterning masks.

Consequently, one or more underlying layers of semiconductor topography 54 may be patterned in alignment with resist mask 52 as shown in FIG. 10. FIG. 10 also illustrates the removal of resist mask 52. Such a removal may be similar to the removal process used to remove resist 38 as described for FIG. 7a. In an embodiment, layers 26–32 may be patterned in alignment with resist mask 52 to form lower portion 56 as shown in FIG. 10. In such an embodiment, lower portion 56 may serve as an electrode of the semiconductor feature formed from semiconductor topography 54. In this manner, in an embodiment in which a MTJ is formed from semiconductor topography 54, the MTJ may include a tunneling layer (i.e., metal insulating layer 32) patterned in alignment with an underlying electrode. In addition, the electrode may include a plurality of layers. As such, the base layer of the electrode may not need to be as thick as a conventional device comprising an electrode with a single layer. For example, in some embodiments, lower portion 56 may include a lower-most layer with a thickness less than approximately 100 angstroms. In any case, the etching process may be similar to the etching process described for FIG. 6a. In other embodiments, metal insulating layer 32 and upper metal layer 30 may be patterned to form a lower portion of semiconductor topography 54 such that the patterning process is terminated upon exposure of pinning layer 28. Such an embodiment may be similar to the etching process described for FIG. 6c.

In addition, such an embodiment may include subsequently patterning seed layer 26 and pinning layer 32 to form an electrode for the patterned semiconductor structure. In some embodiments, seed layer 26 and pinning layer 32 may be patterned in alignment with the overlying lower portion of semiconductor topography 54. Alternatively, seed layer 26 and pinning layer 32 may be patterned having a greater width than the overlying lower portion of semiconductor topography 54. In this manner, in an embodiment in which a MTJ is formed from semiconductor topography 54, the MTJ may include a tunneling layer (i.e., metal insulating layer 32) patterned with a smaller width than an underlying electrode. In either embodiment, seed layer 26 and pinning layer 28 may be patterned using a resist mask or spacers arranged along the sidewalls of metal insulating layer 32 and lower metal layer 30 as described below.

As in the embodiment illustrated in FIGS. 1–8, spacers may be formed upon the sidewall surfaces of upper portion 40 and/or lower portion 56. In particular, spacers may be formed upon the sidewall surfaces of each portion subsequent to the formation of each portion as described for FIGS. 5 and 7b. Alternatively, spacers may be formed upon the sidewall surfaces of each portion simultaneously and subsequent to the formation of lower portion 56 as shown in FIG. 11. FIG. 11 depicts spacers 58 and 59 formed along the sidewalls of upper portion 40 and lower portion 56, respectively. In some embodiments, spacers 58 and 59 may be formed by etching a dielectric material, such as silicon dioxide or silicon nitride, deposited above the semiconductor topography depicted in FIG. 10. Although FIG. 11 shows lower portion 56 extending beyond the lateral boundaries of spacers 58, other embodiments may include configurations in which the lateral boundaries of spacers 58 are in alignment with the sidewalls of lower portion 56. In yet other embodiments, no spacers may be formed along the sidewalls of upper portion 40 and lower portion 56.

Figure 12A:
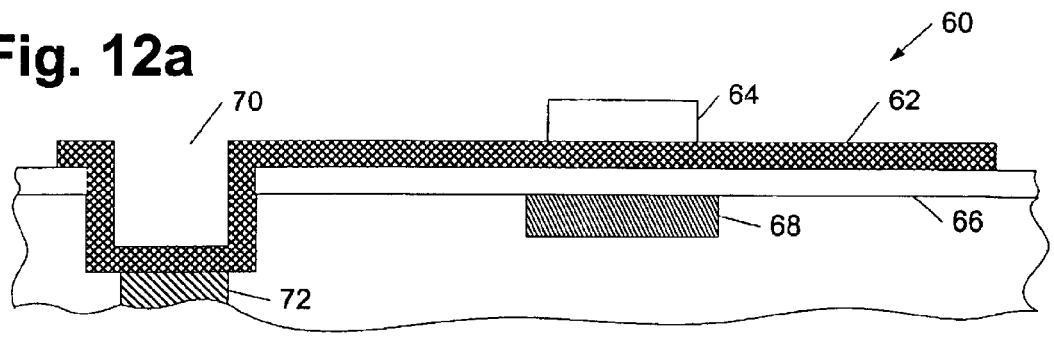
FIG. 12a depicts a partial cross-sectional view of a semiconductor device including a semiconductor feature with an upper and a lower portion comprising different widths.
Figure 12B:
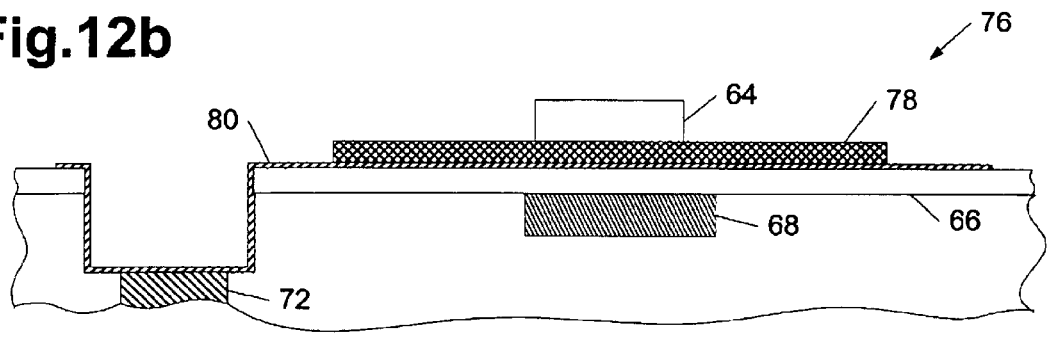
FIG. 12b depicts a partial cross-sectional view of a semiconductor device, in an alternative embodiment, including a semiconductor feature with an upper, an intermediate, and a lower portion comprising different widths.
Figure 12C:
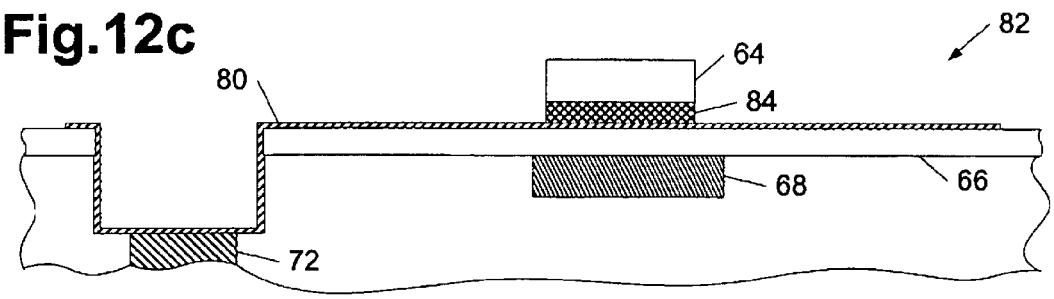
FIG. 12c depicts a partial cross-sectional view of a semiconductor device, in an alternative embodiment, including a semiconductor feature with two portions having approximately the same width and a third portion comprising a different width that the two portions.

As noted above, in some embodiments, the method described herein may be used to form a MTJ. As such, the method described herein may be used to form a semiconductor device comprising a MTJ. For example, in some embodiments, the MTJ may be formed within a magnetic random access memory (MRAM). Alternatively, the MTJ may be formed in a microelectromechanical systems (MEMS) device or any device benefiting from such a junction. FIGS. 12a–12c illustrate a partial cross-sectional view of semiconductor device 60 including a MTJ formed from different embodiments of the method described herein. In particular, FIG. 12a depicts a partial cross-sectional view of a MRAM device including upper portion 64 of a MTJ and electrode 62 comprising the lower portion of the MTJ. As shown in FIG. 12a, electrode 62 may extend above dielectric 66 and in via 70 to connect with contact 72. In addition, semiconductor device 60 may include digit line 68, which is insulated within interlevel dielectric layer 74 and spaced below upper portion 64. Such an embodiment of a MTJ may be formed by the method described in FIGS. 1–6a and 7a, for example. Alternatively, such an embodiment of a MTJ may be formed by the method described in FIGS. 9–10.

In general, the components of semiconductor device 60 may include similar composition and thickness of components of a conventional semiconductor device with the exception of upper portion 64 and electrode 62. In particular, dielectric 66 may include a material and a thickness adapted to isolate digit line 68 and electrode 62. In addition, digit line 68 and contact 72 may include any conductive material such that electrical connection may be made to the structures. Moreover, interlevel dielectric 74 may include any dielectric material sufficient to isolate the components shown within interlevel dielectric 74 and underlying components. Upper portion 64, on the other hand, may include one or more magnetic materials and in some embodiments, a cap metal layer. For example, upper portion 64 may include similar materials to those described for upper metal layer 34 and cap layer 36 in FIGS. 1–11. In some cases, upper portion 64 may serve as the "free" magnetic layer of the MJT. More particularly, the magnetic layers of upper portion 64 may be adapted such that their magnetic orientation is able to rotate relative to the magnetic direction of electrode 62.

Conversely, electrode 62 may include one or more magnetic layers to serve as the fixed magnetic layer of the MTJ. More particularly, electrode 62 may include a material adapted to maintain its magnetic orientation in a single direction. In this manner, the magnetic orientation of electrode 62 may not be rotated in the presence of an applied magnetic field. In addition, electrode 62 may include a tunneling layer arranged above the one or magnetic layers such that quantum mechanical tunneling between electrode 62 and upper portion 64 may occur. In such an embodiment, the tunneling layer may have a width greater than a width of an overlying magnetic layer. In addition, the tunneling layer may be patterned in alignment with an underlying electrode. As such, electrode 62 may include one or metal layers arranged below the magnetic layers. In particular, electrode 62 may include seed and pinning layers similar to seed layer 26 and pinning layer 28 described in FIGS. 1–11.

In addition, electrode 62 may include an additional conductive layer arranged below the seed layer. Such an additional conductive layer may be similar to conductive layer 24 described in FIGS. 1–8. Alternatively, electrode 62 may be absent of a metal layer underneath the seed layer. In either embodiment, the base layer of the electrode may not need to be as thick as a conventional device comprising an electrode with a single layer. For example, in some embodiments, electrode 62 may include a lower-most layer with a thickness less than approximately 100 angstroms. In some embodiments, upper portion 64 and/or electrode 62 may further include spacers (not shown) arranged along the sidewalls of the features. In general, the spacers may be formed in a similar manner as described with reference to FIGS. 5, 7b, and/or 11. In yet other embodiments, the spacers may not be included within semiconductor device 60.

In another embodiment, the method described herein may be used to form a MTJ similar to the configuration within semiconductor device 76 shown in FIG. 12b. In particular, FIG. 12b illustrates upper portion 64 and lower portion 78 of a MJT formed above electrode 80. As with electrode 62 within semiconductor device 60 of FIG. 12a, electrode 80 may extend above dielectric 66 and in via 70 to connect with contact 72. In contrast, however, electrode 80 may not include all of the layers within lower portion 78. On the contrary, in some embodiments, electrode 80 may only include a conductive layer similar to that of conductive layer 24 described in FIGS. 1–8. In other embodiments, electrode 80 may include a plurality of layers, similar to conductive layer 24, seeding layer 26, and pinning layer 28 of FIGS. 1–8. In yet other embodiments, electrode 80 may include a seeding layer and/or a pinning layer without a conductive layer arranged beneath. In any embodiment, electrode 80 may not include the magnetic layers or tunneling layer included within lower portion 78.

The MTJ arranged within semiconductor device 76 may be formed by the method described in FIGS. 1–5, 6b or 6c, and 7b–8. As such, in some embodiments, semiconductor device 76 may further include spacers (not shown) formed about electrode 80, lower portion 78, and/or upper portion 64. Alternatively, the MTJ arranged within semiconductor device 76 may be formed using resist masks rather than spacers to pattern lower portion 78 and electrode 80 as described in FIGS. 9 and 10. In either embodiment, lower portion 78 may be formed having a width greater than upper portion 64 and less than electrode 80, as shown in FIG. 12b.

FIG. 12c illustrates yet another embodiment in which the method described herein may be used to form a MTJ within a semiconductor device. In particular, FIG. 12c illustrates semiconductor device 82 including upper portion 64 and lower portion 84 of a MJT formed above electrode 80. Electrode 80 may be similar to electrode 80 of semiconductor device 76 in FIG. 12b. As such, electrode 80 may include a single conductive layer or a plurality of conductive layers. In addition, lower portion 84 may include similar materials as lower portion 78 in FIG. 12b. For example, lower portion 84 may include a tunneling layer arranged upon one or more magnetic layers. In some cases, lower portion 84 may further include a seed layer and/or a pinning layer. In such an embodiment, however, upper portion 64 and lower portion 84 may be formed in alignment with each other such that both portions have substantially the same width. Such a configuration is not described in the steps of FIGS. 1–11, however, the configuration may be fabricated using the method described herein. More specifically, the configuration may be patterned using similar etch process parameters as described herein. In some embodiments, semiconductor device 82 may further include spacers (not shown) formed about electrode 80, lower portion 84, and upper portion 64.

Figure 13:
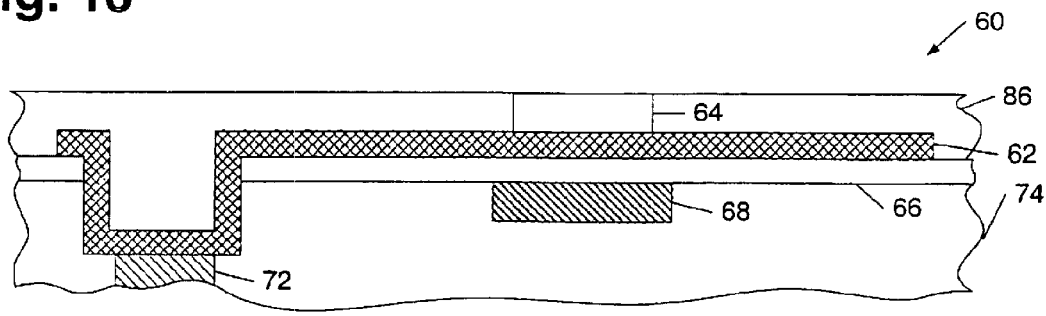
FIG. 13 depicts a partial cross-sectional view of the semiconductor device of FIG. 12a in which an interlevel dielectric is formed above the lower portion.
Figure 14:
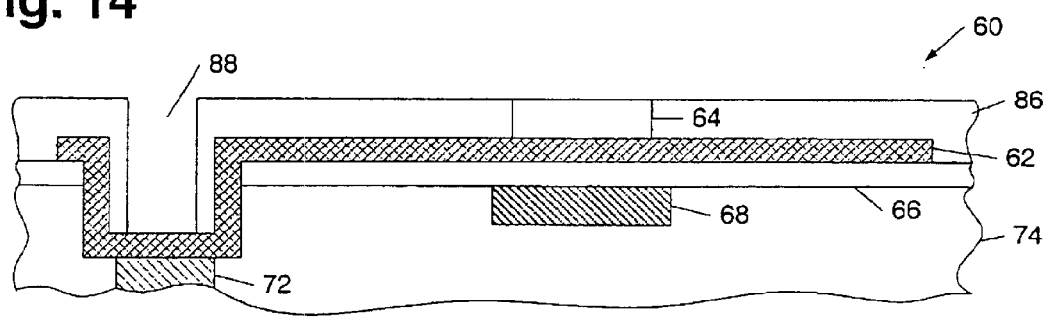
FIG. 14 depicts a partial cross-sectional view of the semiconductor device in which a via is etched within the interlevel dielectric subsequent to the formation of the interlevel dielectric in FIG. 13.
Figure 15:
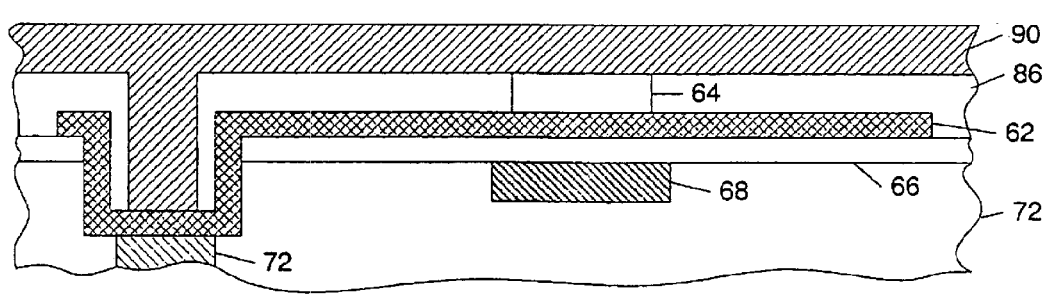
FIG. 15 depicts a partial cross-sectional view of the semiconductor device in which the via is filled subsequent to the formation of the via in FIG. 14.

As stated above, the metal insulating layer of the semiconductor topographies described herein may be used as an etch stop layer during subsequent processing. For example, the tunneling layer comprising the upper surface of lower portion 62 in FIG. 12a may be used as an etch stop layer during a subsequent via etch process in an interlevel dielectric formed above the MTJ. An illustration of the tunneling layer serving as such an etch stop layer is illustrated in FIGS. 13–15. In particular, FIG. 13 depicts semiconductor device 60 subsequent to the deposition of interlevel dielectric 86 upon lower portion 62, upper portion 64, and portions of dielectric 66. In some embodiments, interlevel dielectric 86 may planarized to be made coplanar with upper portion 64 as shown in FIG. 13. In this manner, contact to the upper surface of upper portion 64 may be made.

In some embodiments, via 88 may be etched through interlevel dielectric 86 residing within via 70 to expose lower portion 62. Such an etch process may include wet or dry etch techniques. In particular, the etch chemistry used to form via 88 may be more selective to the material of interlevel 86 than the tunneling layer of lower portion 62. In this manner, the tunneling layer may further serve as a etch stop layer in the region of via 88. Such an embodiment may be advantageous over conventional semiconductor devices, which only include a single conductive layer within the electrode. The via etch process during the fabrication of such conventional devices may undesirably etch through the electrode, thereby disturbing the conductive line of the electrode. In some embodiments, such a disturbance may cause the device to malfunction or cease to operate. The method described herein, however, may allow a portion of the upper surface of electrode 62 to be etched without substantially disturbing the conductivity of the electrode. In addition, the method described herein offers an electrode with a plurality of layers. As such, the base layer of the electrode may not need to be as thick as a conventional device comprising an electrode with a single layer. For example, in some embodiments, electrode 62 may include a lower-most layer with a thickness less than approximately 100 angstroms.

Subsequent to the formation of via 88, conductive layer 90 may be deposited within and upon portions of interlevel dielectric 86 and upper portion 64. Conductive layer 90 may serve to make electrical connection with electrode 62. As such, conductive layer 90 may include doped polysilicon or any metal material, such as aluminum, cobalt, copper, iron, nickel, nickel-iron-chromium, platinum, tantalum, titanium, tungsten, or a metal alloy thereof. In some embodiments, conductive layer 90 may serve as a bit line of a MRAM device, for example. It is noted that the formation of a via and a conductive line such as via 88 and conductive line 90 may also be formed upon semiconductor devices 76 and 82 of FIGS. 12b and 12c, respectively. In addition, the formation of a via and a conductive line may also be formed upon semiconductor topographies 20 and 54 of FIGS. 7a, 8, and 10 or any semiconductor topography including a metal oxide layer arranged below a dielectric material.

It will be appreciated to those skilled in the art having the benefit of this disclosure that this invention is believed to provide a method for etching one or more metal layers to expose a metal insulating layer. In addition, the method may be used to form a different MTJ configuration within a semiconductor device. Further modifications and alternative embodiments of various aspects of the invention will be apparent to those skilled in the art in view of this description. For example, the method described herein may be used in any application in which one or metal layers may be patterned above a metal insulating layer. Such applications may include but are not limited to, MTJs within MRAM devices and/or MEMS devices. It is intended that the following claims be interpreted to embrace all such modifications and changes and, accordingly, the drawings and the specification are to be regarded in an illustrative rather than a restrictive sense.

What is claimed is:

1. A magnetic tunneling junction, comprising:
   a tunneling layer having a width greater than a width of an overlying magnetic layer;
   an electrode arranged below the tunneling layer having a width greater than the width of the tunneling layer;
   a first set of formed along the sidewalls of the overlying magnetic layer and upon adjacent portions of the tunneling layer, wherein a lateral boundary of the first set of spacers is in alignment with a sidewall of the tunneling layer; and
   a second set of spacers formed along the sidewalls of the tunneling layer and upon adjacent portions of the electrode, wherein a lateral boundary of the second set of spacers is spaced apart from a sidewall of the electrode.

2. The magnetic tunneling junction of claim 1, further comprising one or more additional layers interposed between the tunneling layer and the electrode, wherein the one or more additional layers comprise widths substantially similar to the width of the tunneling layer.

3. The magnetic tunneling junction of claim 1, wherein a lateral boundary of the second set of spacers is in alignment with a sidewall of the electrode.

4. The magnetic tunneling junction of claim 1, wherein the width of the tunneling layer is approximately 10 angstroms to approximately 200 angstroms greater than the width of the overlying magnetic layer.

5. The magnetic tunneling junction of claim 1, wherein the overlying magnetic layer comprises a ferromagnetic material.

6. The magnetic tunneling of junction of claim 1, wherein the tunneling layer comprises aluminum oxide.

7. The magnetic tunneling junction of claim 1, wherein a lower-most layer of the electrode comprises a thickness equal to or less than approximately 100 angstroms.

8. A magnetic tunneling junction, comprising:
   a tunneling layer having a width greater than a width of an overlying magnetic layer;
   an electrode arranged below the tunneling layer and having a width greater than the width of the tunneling layer;
   a first set of spacers formed along the sidewalls of the tunneling layer and upon adjacent portions of the electrode, wherein a lateral boundary of the first set of spacers is in a alignment with a sidewall of the electrode; and
   a second set of spacers formed along the sidewalls of the overlying magnetic layer and upon adjacent portions of the tunneling layer.

9. The magnetic tunneling junction of claim 8, wherein a lateral boundary of the second set of spacers is in alignment with a sidewall of the tunneling layer.

10. The magnetic tunneling junction of claim 8, wherein a lateral boundary of the second set of spacers is spaced apart from a sidewall of the tunneling layer.

11. The magnetic tunneling junction of claim 8, further comprising one or more additional layers interposed between the tunneling layer and the electrode, wherein the one or more additional layers comprise widths substantially similar to the width of the tunneling layer.

12. The magnetic tunneling junction of claim 8, wherein a lower-most layer of the electrode comprises a thickness equal to or less than approximately 100 angstroms.

* * * * *

UNITED STATES PATENT AND TRADEMARK OFFICE
CERTIFICATE OF CORRECTION

PATENT NO.    : 6,897,532 B1
DATED         : May 24, 2005
INVENTOR(S)   : Schwarz et al.

It is certified that error appears in the above-identified patent and that said Letters Patent is hereby corrected as shown below:

Title page,
Item [74], *Attorney, Agent, or Firm*, delete "Kevin L. Duffer" and substitute -- Kevin L. Daffer --.

Column 21,
Line 20, after "tunneling layer" insert -- and --.
Line 22, after "first set of" insert -- spacers --.

Signed and Sealed this

Seventeenth Day of January, 2006

JON W. DUDAS
*Director of the United States Patent and Trademark Office*